United States Patent
Zhang

(10) Patent No.: US 9,502,691 B2
(45) Date of Patent: Nov. 22, 2016

(54) ORGANIC LIGHT-EMITTING DIODE DISPLAY PANEL AND MANUFACTURING METHOD THEREOF

(71) Applicant: BOE TECHNOLOGY GROUP CO., LTD., Beijing (CN)

(72) Inventor: Can Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 13 days.

(21) Appl. No.: 14/406,684

(22) PCT Filed: May 12, 2014

(86) PCT No.: PCT/CN2014/077298
§ 371 (c)(1),
(2) Date: Dec. 9, 2014

(87) PCT Pub. No.: WO2015/096351
PCT Pub. Date: Jul. 2, 2015

(65) Prior Publication Data
US 2015/0372257 A1    Dec. 24, 2015

(30) Foreign Application Priority Data
Dec. 26, 2013    (CN) .......................... 2013 1 0738154

(51) Int. Cl.
*H01L 51/52* (2006.01)
*H01L 51/56* (2006.01)

(52) U.S. Cl.
CPC ........... *H01L 51/5275* (2013.01); *H01L 51/56* (2013.01); *H01L 2251/301* (2013.01); *H01L 2251/303* (2013.01)

(58) Field of Classification Search
CPC ............... H01L 51/5275; H01L 51/56; H01L 2251/301; H01L 2251/303
See application file for complete search history.

(56) References Cited

U.S. PATENT DOCUMENTS 6,911,674 B2    6/2005    Evans
7,527,398 B2    5/2009    Song et al.
(Continued)

FOREIGN PATENT DOCUMENTS

CN    1509126 A    6/2004
CN    1678156 A    10/2005
(Continued)

OTHER PUBLICATIONS

International Search Report, International Preliminary Report on Patentability and Written Opinion of the International Searching Authority of PCT/CN2014/077298 in Chinese, mailed Sep. 19, 2014.
(Continued)

*Primary Examiner* — John P Dulka
(74) *Attorney, Agent, or Firm* — Collard & Roe, P.C.

(57) ABSTRACT

An organic light-emitting diode (OLED) display panel and manufacturing method thereof. The method of manufacturing the OLED display panel comprises forming an anode (2), an organic light-emitting layer (3), a cathode (4) and a first optical coupling layer (5) sequentially on a substrate (1), and forming a second optical coupling layer (6) on a side, away from the cathode (4), of the first optical coupling layer (5) by arranging a plurality of protrusion structures with arc-shaped surfaces. Light that would be totally reflected from a surface of the first optical coupling layer are transmitted out through the protrusion structures with the arc-shaped surfaces of the second optical coupling layer, therefore the total reflection of the light is reduced, the light extraction efficiency is increased, and the external quantum efficiency of the device is improved.

20 Claims, 2 Drawing Sheets

(56) References Cited

U.S. PATENT DOCUMENTS

| | | | |
|---|---|---|---|
| 2005/0052130 A1* | 3/2005 | Wei | H01L 51/5262 |
| | | | 313/506 |
| 2008/0122347 A1* | 5/2008 | Lee | H01L 27/3244 |
| | | | 313/504 |
| 2008/0122348 A1 | 5/2008 | Jeong et al. | |
| 2009/0152533 A1 | 6/2009 | Chan et al. | |
| 2010/0084677 A1 | 4/2010 | Michellys | |
| 2013/0291413 A1 | 11/2013 | Lifka et al. | |
| 2015/0123093 A1 | 5/2015 | Reusch et al. | |

FOREIGN PATENT DOCUMENTS

| | | |
|---|---|---|
| CN | 1806338 A | 7/2006 |
| CN | 1945849 A | 4/2007 |
| CN | 101714614 A | 5/2010 |
| CN | 101946341 A | 1/2011 |
| CN | 103490020 A | 1/2014 |
| CN | 103715372 A | 4/2014 |
| CN | 203690349 U | 7/2014 |
| JP | 2014-508314 A | 4/2014 |
| WO | 2013/164271 A1 | 11/2013 |

OTHER PUBLICATIONS

Chinese Office Action of Chinese Application No. 201310738154.6, mailed Jul. 28, 2015 with English translation.
Second Chinese Office Action in Chinese Application No. 201310738154.6, mailed Dec. 17, 2015 with English translation.
English translation of the International Preliminary Report on Patentability and Written Opinion of the International Searching Authority of PCT/CN2014/077298, issued Jun. 28, 2016.

* cited by examiner

US 9,502,691 B2

ORGANIC LIGHT-EMITTING DIODE DISPLAY PANEL AND MANUFACTURING METHOD THEREOF

CROSS REFERENCE TO RELATED APPLICATIONS

This application is the National Stage of PCT/CN2014/077298 filed on May 12, 2014, which claims priority under 35 U.S.C. §119 of Chinese Application No. 201310738154.6 filed on Dec. 26, 2013, the disclosure of which is incorporated by reference.

TECHNICAL FIELD

Embodiments of the present invention relate to an organic light-emitting diode (OLED) display panel and a manufacturing method thereof.

BACKGROUND

Organic light-emitting diodes (OLEDs) have the excellent characteristics, such as self-luminescence, all solid state, wide viewing angle, fast response, and a great application future in the flat panel display. The OLED is regarded as a new generation of flat panel display product and technology after liquid crystal display (LCD) and plasma display panel (PDP). Currently, the OLED already has a wide application in display and lighting field. The external quantum efficiency of the semiconductor light-emitting element needs to be improved in order to ensure that the semiconductor light-emitting element has high reliability of function and low power dissipation. Typically, the external quantum efficiency of the semiconductor light-emitting element is dependent on internal quantum efficiency and light extraction efficiency of its own. The internal quantum efficiency is dependent on the characteristics of the material per se. Therefore, it is important to increase the light extraction efficiency of the semiconductor light-emitting element in the case that the internal quantum efficiency cannot be effectively improved.

SUMMARY

At least one embodiment of the present invention provides a method of manufacturing an organic light-emitting diode (OLED) display panel, comprising: sequentially forming an anode, an organic light-emitting layer, a cathode and a first optical coupling layer on a substrate, and forming a second optical coupling layer on a side away from the cathode, of the first optical coupling layer by arranging a plurality of protrusion structures with arc-shaped surfaces.

In an example, a first mask plate is used to implement evaporation on the first optical coupling layer to form a second optical coupling layer. The first mask plate comprises a plurality of holes configured to evaporate the second optical coupling layer, and wall of the hole is perpendicular to a surface of the first mask plate.

In an example, the holes of the first mask plate are slits, and the slits are arranged in a direction that is perpendicular to a direction of slits arranged in the second mask plate used in a procedure of forming the organic light-emitting layer. The protrusion structures with the arc-shaped surfaces formed by evaporation are strip-shaped semi-cylinders.

In an example, each of the slits of the first mask plate has a width less than that of the second mask plate.

In an example, the holes of the first mask plate are dot-like shaped. The protrusion structures with the arc-shaped surfaces formed by evaporation are hemisphere-like shaped.

In an example, the dot-like hole has an aperture width which is less than the width of slits on the second mask plate used in a procedure of forming the organic light-emitting layer.

In an example, a sum of the thickness of the first optical coupling layer and that of the second optical coupling layer is $\lambda/4n$, where $\lambda$ is an emission peak wavelength, $n$ is a refractive index of the first optical coupling layer and the second optical coupling layer.

In an example, $n$ is greater than or equal to 1.8.

In an example, the first optical coupling layer and the second optical coupling layer are formed by a material comprising a ZnSe, $TiO_2$, $SiO_2$, $Si_3N_4$ or Alq3, or mixture of at least two thereof.

At least one embodiment of the present invention provides an organic light-emitting diode (OLED) display panel, comprising an anode, an organic light-emitting layer, a cathode and a first optical coupling layer sequentially formed on a substrate, and a second optical coupling layer formed on a side away from the cathode, of the first optical coupling layer, by arranging a plurality of protrusion structures with the arc-shaped surfaces.

In an example, the protrusion structures with the arc-shaped surfaces are strip-shaped semi-cylinders.

In an example, a diameter of the semi-cylinder is less than a width of a sub-pixel of the display panel.

In an example, the protrusion structures with the arc-shaped surfaces are hemisphere-like shaped.

In an example, the aperture width of the hemisphere is less than the width of a sub-pixel of the display panel.

In an example, a sum of the thickness of the first optical coupling layer and that of the second optical coupling layer is $\lambda/4n$, wherein $\lambda$ is an emission peak wavelength, $n$ is a refractive index of the first optical coupling layer and the second optical coupling layer.

In an example, $n$ is greater than or equal to 1.8.

In an example, the first optical coupling layer and the second optical coupling layer are formed by a material comprising any of ZnSe, $TiO_2$, $SiO_2$, $Si_3N_4$ or Alq3, or mixture of at least two thereof.

BRIEF DESCRIPTION OF THE DRAWINGS

Embodiments of the present invention will be described in detail hereinafter in conjunction with accompanying drawings to allow one of ordinary skill in the art to understand the present invention more clearly, in which.

DETAILED DESCRIPTION

In order to make objects, technical details and advantages of the embodiments of the invention apparent, technical details and advantages of the embodiments of the invention apparent, technical solutions according to the embodiments of the present invention will be described clearly and completely as below in conjunction with the accompanying drawings of embodiments of the present invention. It is to be understood that the described embodiments are only a part of but not all of exemplary embodiments of the present invention. Based on the described embodiments of the present invention, various other embodiments can be obtained by those of ordinary skill in the art without creative labor and those embodiments shall fall into the protection scope of the present invention.

Unless otherwise defined, all the technical and scientific terms used herein have the same meanings as commonly understood by one of ordinary skill in the art to which the present invention belongs. The terms, such as "first," "second," or the like, which are used in the description and the claims of the present application, are not intended to indicate any sequence, amount or importance, but for distinguishing various components. Also, the terms, such as "a/an," "one," or the like, are not intended to limit the amount, but for indicating the existence of at lease one. The terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and when the position of the object which is described is changed, the relative position relationship may be changed accordingly.

Figure 1:
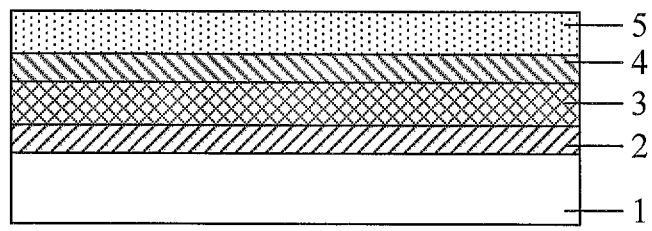
FIG. 1 is a schematic structural view of an OLED display panel.

A material having an appropriate thickness and a matching refractive index can be used as a cathode capping layer for improving the light extraction efficiency of a top emitting device. Typically, the greater the refractive index of the material is, the higher the transmittance of cathode is, and the easier the light extraction is. Therefore, a anti-reflection layer is usually made of high refractive index material so as to increase the light extraction efficiency of the top emitting device. In the OLED display panel as shown in FIG. 1, an anode 2, an organic light-emitting layer 3 and a cathode 4 sequentially formed on a substrate 1, wherein a planar optical coupling layer 5 is formed on a side, away from the substrate 1, of the cathode 4. Since the refractive index of the anti-reflection layer is larger than the refractive index of air, a portion of light is totally reflected when the light is transmitted on the top of the cathode capping layer. Therefore, the total reflection is occurred on the light outlet side, which is disadvantage to the light extraction, and some light is lost.

Figure 2:
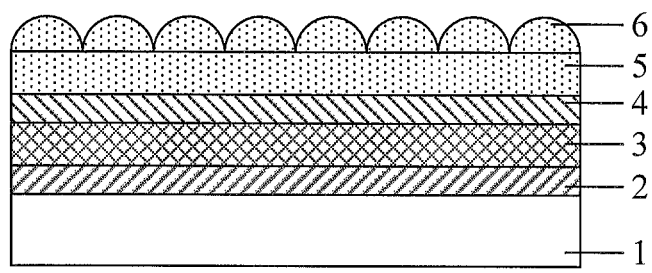
FIG. 2 is a schematic view of a fine mask plate for a normal pixel provided in the method of manufacturing the OLED display panel according to an embodiment of the present invention.

Embodiments of the present invention provide a method of manufacturing the OLED display panel as shown in FIG. 2, the method comprises following steps.

Step S1, an anode 2, an organic light-emitting layer 3, a cathode 4 and a first optical coupling layer 5 are sequentially formed on a substrate 1. Each pixel of the OLED display panel comprises a anode 2, a organic light-emitting layer 3, a cathode 4 and a first optical coupling layer 5 correspondingly. The anode 2, the organic light-emitting layer 3, the cathode 4 and the first optical coupling layer 5 are manufactured by using common mask plate(s). For example, the corresponding anode 2, organic light-emitting layer 3, cathode 4 and first optical coupling layer 5 are sequentially evaporated on the substrate 1 via common mask plate(s). The step of manufacturing the organic light-emitting layer 3 comprises evaporating a hole injection layer and a hole transport layer on the anode, sequentially; evaporating sub pixel R, G, B light-emitting layers on the hole transport layer, respectively; evaporating an electron transport layer on the light-emitting layer; and evaporating a electron injection layer on the electron transport layer.

Figure 3:
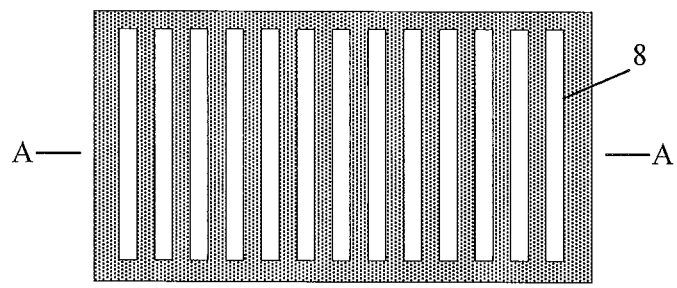
FIG. 3 is a schematic across section view along A-A of the fine mask plate of the normal pixel in FIG. 2.
Figure 4:
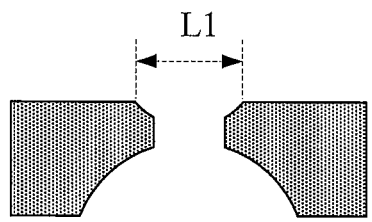
FIG. 4 is a schematic view of a fine mask plate provided in the method of manufacturing the OLED display panel according to an embodiment of the present invention.

FIGS. 3 and 4 respectively shows a schematic view and a schematic across section of a common mask plate (a second mask plate) used to evaporate sub pixel R, G, B light-emitting layers. A plurality of parallel slits 8 are arranged in the second mask plate, R, G, B light-emitting material are evaporated on the hole transport layer through the slits 8. The R, G, B sub pixel light-emitting layers are only illustrative but not intended to limit the present invention, and the sub pixel emitting layer can be other colors, such as yellow or white and the like. The across section of the slits on the second mask plate is shown as in FIG. 3 so as to prevent the pattern of each layer in each sub pixel being evaporated as a hemisphere. The method of manufacturing the second mask plate is routine manufacturing method, which is not described herein.

Step S2, a second optical coupling layer 6 is formed on a side, away from the cathode 4, of the first optical coupling layer 5 by arranging a plurality of protrusion structures with arc-shaped surfaces. The step S2 comprises performing an evaporating process on the first optical coupling layer 5 by using a first mask plate to form a second optical coupling layer 6. The first mask plate has a plurality of holes used to evaporate the second optical coupling layer 6, and the wall of the hole is perpendicular to a surface of the first mask plate. In this way, the protrusion structures with the arc-shaped surfaces are formed by the material passing through the holes.

The surface of the second optical coupling layer 6 is designed as the protrusion structures with the arc-shaped surfaces so that the light transmitted on the surface of the first optical coupling 5 is scattered, thereby the light that would be totally reflected is transmitted out, therefore the total reflection of the light is reduced, the light extraction efficiency is increased, and the external quantum efficiency of the device is improved.

Figure 5:
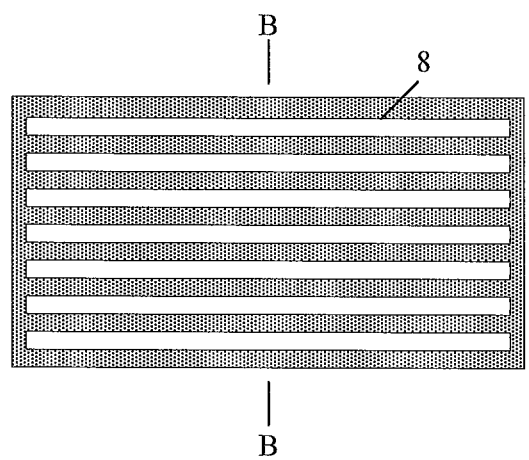
FIG. 5 is a schematic across section view along B-B of the fine mask plate in FIG. 4.
Figure 6:
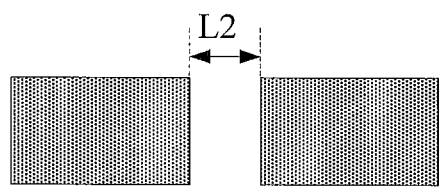
FIG. 6 is a schematic structural view of the OLED according to an embodiment of the present invention.

As shown in FIGS. 5 and 6, the holes 8 of the first mask plate can be slits, and the protrusion structures with the arc-shaped surfaces formed by evaporation are strip-shaped semi-cylinders. For example, the slits of the first mask plate are arranged in a direction that is perpendicular to a direction of slits arranged in the second mask plate used in a procedure of forming the organic light-emitting layer 5. Such a manufacturing process is simple and the semi-cylinders can be arranged closely, thereby further increasing the light extraction efficiency and improving the external quantum efficiency of the device.

In a embodiment, each of the slits of the first mask plate has a width narrower than that of the second mask plate so that a radius of the semi-cylinder formed by evaporation is less than the width of sub pixel, thereby to be more helpful to light extraction. For example, when the sub-pixel size of incident light is 40 μm×120 μm, the hole size L1 of the second mask plate is about 46.5 μm, the hole size L2 of the first mask plate is about 3 μm; when the sub-pixel size of incident light is 200 μm×60 μm, the hole size L1 of the second mask plate is about 70 μm, the hole size L2 of the first mask plate is about 5 μm. In this way, the radius of the semi-cylinder is much less than the width of sub pixel.

The holes 8 of the first mask plate can be dot shaped; and the protrusion structures with the arc-shaped surfaces formed by evaporation are hemisphere shaped. The dot shaped hole has an aperture that is less than the width of slits on the second mask plate used in a procedure of forming the organic light-emitting layer 5.

In an embodiment, a sum of the thickness of the first optical coupling layer 5 and that of the second optical coupling layer 6 is $\lambda/4n$, where $\lambda$ is an emission peak wavelength, n is a refractive index of the first optical coupling layer 5 and the second optical coupling layer 6. Since a material with higher refractive index is helpful to the light extraction, n is greater than or equal to 1.8 so as to increase the external quantum efficiency as far as possible.

For example, the first optical coupling layer 5 and the second optical coupling layer 6 are selected from a material with higher refractive index, such as any of ZnSe, $TiO_2$, $SiO_2$, $Si_3N_4$, or Alq3 (8-hydroxyquinoline aluminum) or a mixture of at least two thereof.

In the manufacturing procedure, the distance between two adjacent slits or circular holes on the first mask plate reaches an appropriate distance so that two adjacent strip-shaped semi-cylinders or two adjacent hemispheres formed by evaporation are closely contact with each other, thereby to further increase the external quantum efficiency.

The embodiment of the present invention further provides an OLED display panel. As shown in FIG. 2, it comprises an anode 2, an organic light-emitting layer 3, a cathode 4, a first optical coupling layer 5 sequentially formed on a substrate 1. The display panel further comprises a second optical coupling layer 6 formed on a side, away from the cathode 4, of the first optical coupling layer 5 by arranging a plurality of protrusion structures with arc-shaped surfaces.

In an embodiment, the protrusion structures with the arc-shaped surfaces are strip-shaped semi-cylinders. A diameter of the semi-cylinder is less than the width of a sub-pixel of the display panel.

The protrusion structures with the arc-shaped surfaces may be hemisphere shaped. The aperture of the hemisphere is less than the width of the sub-pixel of the display panel.

A sum of the thickness of the first optical coupling layer and that of the second optical coupling layer is $\lambda/4n$, where $\lambda$ is an emission peak wavelength, n is a refractive index of the first optical coupling layer and the second optical coupling layer. In an embodiment, n is greater than or equal to 1.8.

The first optical coupling layer and the second optical coupling layer are selected from a material with higher refractive index, such as any of ZnSe, $TiO_2$, $SiO_2$, $Si_3N_4$, Alq3 (8-hydroxyquinoline aluminum), or a mixture of at least two thereof.

The embodiments of the present invention provide an OLED display panel and manufacturing method thereof. Light that would be totally reflected from the surface of the first optical coupling layer are transmitted out through the protrusion structures with the arc-shaped surfaces of the second optical coupling layer, therefore the total reflection of the light is reduced, the light extraction efficiency is increased, and the external quantum efficiency of the device is improved.

It is understood that the described above are only illustrative embodiments and implementations for explaining the present invention, and the present invention is not intended to limited thereto. For one of ordinary skill in the art, various modifications and improvements may be made without departing from the spirit and scope of embodiments of the present invention, and all of which should fall within the protection scope of the present invention. The scope protected by the present invention is defined by the claims.

The present invention claims priority of Chinese patent application No. 201310738154.6 filed on Dec. 26, 2013, entitled "OLED display panel and manufacturing method thereof", the entire contents of which are incorporated herein by reference.

What is claimed is:

1. A method of manufacturing an organic light-emitting diode (OLED) display panel, comprising:
   forming an anode, an organic light-emitting layer, a cathode and a first optical coupling layer sequentially on a substrate; and
   forming a second optical coupling layer on a side of the first optical coupling layer facing away from the cathode by arranging a plurality of protrusion structures with arc-shaped surfaces.

2. The method of manufacturing the OLED display panel according to claim 1, further comprising implementing evaporation on the first optical coupling layer by using a first mask plate to form the second optical coupling layer, wherein the first mask plate comprises a plurality of holes configured to evaporate the second optical coupling layer, and a wall of the holes is perpendicular to a surface of the first mask plate.

3. The method of manufacturing the OLED display panel according to claim 2, wherein each of the slits of the first mask plate has a width less than that of the second mask plate.

4. The method of manufacturing the OLED display panel according to claim 2, wherein the holes of the first mask plate are dot-like shaped so that the protrusion structures with the arc-shaped surfaces formed by evaporation are hemisphere-like shaped.

5. The method of manufacturing the OLED display panel according to claim 4, wherein the dot-like hole has an aperture that is less than the width of the slits on the second mask plate used in a procedure of forming the organic light-emitting layer.

6. The method of manufacturing the OLED display panel according to claim 2, wherein the holes of the first mask plate are slits, and the slits are arranged in a direction that is perpendicular to a direction of slits arranged in the second mask plate used in a procedure of forming the organic light-emitting layer so that the protrusion structures with the arc-shaped surfaces formed by evaporation are strip-shaped semi-cylinders.

7. The method of manufacturing the OLED display panel according to claim 6, wherein each of the slits of the first mask plate has a width less than that of the second mask plate.

8. The method of manufacturing the OLED display panel according to claim 7, wherein the holes of the first mask plate are dot-like shaped so that the protrusion structures with the arc-shaped surfaces formed by evaporation are hemisphere-like shaped.

9. The method of manufacturing the OLED display panel according to claim 8, wherein the dot-like hole has an aperture that is less than the width of the slits on the second mask plate used in a procedure of forming the organic light-emitting layer.

10. The method of manufacturing the OLED display panel according to claim 1, wherein the first optical coupling layer and the second optical coupling layer has a respective thickness and refractive index, and a sum of the thickness of the first optical coupling layer and that of the second optical coupling layer is $\lambda/4n$, where $\lambda$ is an emission peak wavelength, n is the refractive index of the first optical coupling layer and the second optical coupling layer.

11. The method of manufacturing the OLED display panel according to claim 10, wherein n is greater than or equal to 1.8.

12. The method of manufacturing the OLED display panel according to claim 1, wherein the first optical coupling layer and the second optical coupling layer are formed by a material comprising any of ZnSe, $TiO_2$, $SiO_2$, $Si_3N_4$, or Alq3, or a mixture of at least two thereof.

13. An organic light-emitting diode (OLED) display panel, comprising:
   an anode, an organic light-emitting layer, a cathode and a first optical coupling layer sequentially formed on a substrate; and
   a second optical coupling layer formed on a side of the first optical coupling layer facing away from the cathode by arranging a plurality of protrusion structures with arc-shaped surfaces.

14. The OLED display panel according to claim 13, wherein the protrusion structures with the arc-shaped surfaces are strip-shaped semi-cylinders.

15. The OLED display panel according to claim 14, wherein each of the semi-cylinders has a diameter less than a width of a sub-pixel of the display panel.

16. The OLED display panel according to claim 13, wherein the protrusion structures with the arc-shaped surfaces are hemisphere-like shaped.

17. The OLED display panel according to claim 16, wherein the hemisphere has an aperture less than a width of a sub-pixel of the display panel.

18. The OLED display panel according to claim 13, wherein each of the first optical coupling layer and the second optical coupling layer has a respective thickness and refractive index, and a sum of the thickness of the first optical coupling layer and that of the second optical coupling layer is $\lambda/4n$, $\lambda$ is an emission peak wavelength, n is the refractive index of the first optical coupling layer and the second optical coupling layer.

19. The OLED display panel according to claim 18, wherein n is greater than or equal to 1.8.

20. The OLED display panel according to claim 13, wherein the first optical coupling layer and the second optical coupling layer are formed by a material comprising any of ZnSe, $TiO_2$, $SiO_2$, $Si_3N_4$, or Alq3, or a mixture of at least two thereof.

* * * * *